(12) United States Patent
Arishiro et al.

(10) Patent No.: US 6,601,365 B2
(45) Date of Patent: Aug. 5, 2003

(54) COMPONENT HANDLING APPARATUS AND METHOD OF HANDLING THE SAME

(75) Inventors: Masatoshi Arishiro, Sabac (JP); Kunio Okumura, Takefu (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 142 days.

(21) Appl. No.: 09/754,051

(22) Filed: Jan. 5, 2001

(65) Prior Publication Data

US 2001/0008061 A1 Jul. 19, 2001

(30) Foreign Application Priority Data

Jan. 13, 2000 (JP) .......................................... 2000-004413

(51) Int. Cl.[7] ............................................... B65B 57/00
(52) U.S. Cl. .............................. 53/54; 53/443; 53/448; 53/534; 53/591; 406/194; 414/220
(58) Field of Search ............................. 53/53, 54, 443, 53/448, 531, 534, 508, 591; 414/220, 221; 406/194

(56) References Cited

U.S. PATENT DOCUMENTS

| | | | | |
|---|---|---|---|---|
| 2,310,265 A | * | 2/1943 | Sweeny ........................ 406/194 |
| 4,354,337 A | * | 10/1982 | Mori et al. ..................... 53/559 |
| 4,575,995 A | * | 3/1986 | Tabuchi et al. ................ 53/591 |
| 5,131,206 A | * | 7/1992 | Sillner ............................ 53/54 |
| 5,568,870 A | * | 10/1996 | Utech ........................... 209/573 |
| 5,955,776 A | * | 9/1999 | Ishikawa ....................... 257/618 |
| 6,194,679 B1 | * | 2/2001 | Garcia et al. ................. 209/571 |
| 6,200,071 B1 | * | 3/2001 | Karasawa ..................... 406/194 |
| 6,364,089 B1 | * | 4/2002 | Singh et al. .................. 198/408 |
| 6,448,525 B1 | * | 9/2002 | Nishioka et al. ............. 209/574 |

* cited by examiner

*Primary Examiner*—Eugene Kim
*Assistant Examiner*—Christopher Harmon
(74) *Attorney, Agent, or Firm*—Burns, Doane, Swecker & Mathis, LLP (57) ABSTRACT

An apparatus for measuring a component that can carry out processes such as visual inspection, characteristic measurement, screening, and taping efficiently while transporting the electronic component at high speed. In order to transport the electronic components to the index table where the processes such as characteristic measurement, screening, and taping is carried out, a component transporting device is used in which the electronic component delivered from the component delivery section 10 is transported to the component intake port 23 based on negative pressure, transported with the airflow through the transportation path 25, and discharged from the part discharging port 24. The transporting device includes a gas discharging port 33 in the vicinity of the component discharging port, which serves to decrease the transport speed of the electronic component before transporting it to the index table.

8 Claims, 5 Drawing Sheets

COMPONENT HANDLING APPARATUS AND METHOD OF HANDLING THE SAME

This application is related and claims priority under 35 U.S.C. §119 to Japanese Patent Application No. 2000-004413, the entire contents of which are incorporated by reference herein.

BACKGROUND OF THE INVENTION

1. Field of the Invention

The present invention relates to a component handling apparatus and a method of handling the same. More specifically, the present invention relates to a component handling apparatus for handling devices such as electronic components, for visual inspection, characteristic measurement, screening, marking, and taping, while transporting the same.

2. Description of the Related Art

Electronic components, such as monolithic ceramic capacitors, undergo various processes including: visual inspection, characteristic measurement, screening based on a pass/fail criteria, as well as marking, for example, of a product mark, or taping, after manufacturing and prior to shipment.

For example, when carrying out a visual inspection, a plurality of electronic components are successively fed to the station for undergoing a visual inspection, one by one, and then screened based on the result of the visual inspection at the screening station. When carrying out a characteristic measurement, a plurality of electronic components are successively fed to the station for the characteristic measurement, one by one, and screened based on the result of the characteristic measurement at the screening station. Likewise, when carrying out a taping, a plurality of electronic components are successively fed to the taping station one by one, and individually inserted into the cavities provided on the tape.

When carrying out the respective processes for a visual inspection, characteristic measurement, screening, and taping, a handling technique to handle more than one electronic component, while transporting the same, is required.

In order to proceed with each process, i.e., visual inspection, characteristic measurement, screening, marking, or taping efficiently, it is desired to increase both the transport speed of the electronic components and the number of components that can be handled in a unit of time.

As the transportation speed is increased, the impact applied to the electronic components increases, which may cause damage to the electronic components. Likewise, electronic components may jump out from the predetermined path due to a rebound thereof. Therefore, it is desired to prevent damage or jumping out of the electronic components during the high-speed transportation.

It is also desired that the processes for visual inspection, characteristic measurement, screening, marking, or taping, as described above, be carried out successively and, preferably, automatically.

In the characteristic measurement process, for example, sufficient time to carry out a characteristic measurement precisely can be provided for each individual electronic component while increasing the speed as described above.

SUMMARY OF THE INVENTION

Accordingly, it is an object of the present invention to provide a component handling apparatus and a method for handling the components which satisfy the requirements described above.

The first aspect of the present invention is a component handling apparatus for transporting components, including a component transporting device. The transporting device is defined by a hollow transportation path for transporting the components, having a component intake port on one end and a discharging port on the other end.

The component transporting device described above includes a gas intake port for the admission of a flow of gas in the vicinity of the component intake port. The flow of gas taken through the gas intake port provides the component intake port with a negative pressure for feeding components from the outside into the component intake port, and provides a driving force for transporting the components through the transportation path toward the component discharging port.

In addition, the component transporting device comprises a gas discharging port for discharging the gas in the transportation path. Discharging the gas through the gas discharging port decreases the transport speed of the components.

Preferably, in such a component handling apparatus, the transportation path is tapered from the component intake port toward the component discharging port.

Preferably, the gas discharging port includes means for controlling the gas discharging pressure. The gas discharging port may be opened toward the atmosphere for simplifying the structure of the component transporting device.

The component handling means described below is advantageously used while handling electronic components. In such a case, the component handling apparatus includes an index table that can be used for measuring the characteristic of the electronic components and, more specifically, having a plurality of holding recesses along the periphery thereof for receiving the electronic components discharged from the component discharging port. Holding recesses, adjacent one another, are provided in the index table. As the index table rotates, it transports the components in a circumferential direction, towards a characteristic measuring section for measuring the characteristic of the electronic components located at a predetermined position on the transportation path. The electronic components are transported along with the rotation of the index table.

When applied to the characteristic measurement of the electronic components described above, preferably, there is also provided a characteristically defective components discharging section, downstream of the characteristic measuring section, and on the transportation path of the rotation of the index table for discharging the characteristically defective electronic components. A characteristically satisfactory components discharging section provided downstream of the characteristically defective components discharging section for discharging the characteristically satisfactory electronic components may also be provided.

The characteristically satisfactory components discharging section is provided with, for example, a taping device for taping the electronic components, or a device for packing them in bulk.

There may be provided a marking section, for applying marks on the electronic components, at a predetermined position on the transportation path. This will allow the electronic components to be transported, along with the rotation of the index table.

The component handling apparatus as described above may be provided with a component feeding device for feeding the components to the component intake port of the component transporting device, and a visual inspection section for viewing the image of the component.

In this case, the component feeding device includes a components delivering section positioned so as to face toward the component intake port. The components delivered from the component delivering section are sent to the component intake port, while maintaining the state of being suspended in the air based on the negative pressure applied to the component intake port. The visual inspection section picks up the image of the component while it is suspended in the air, but prior to the component entering into the component intake port.

Preferably, the component feeding device described above includes a vibration feeder. The component delivering section is, however, maintained to be free from vibrations.

Preferably, the component delivering section described above includes a aligning groove defined by two side surfaces, arranged in a V-shaped cross section, which comes into contact with the side surfaces of the components. This arrangement facilitates alignment of the components respective to one another. The side surfaces of the aligning grooves are inclined at an angle of 10 to 80 degrees with respect to the vertical plane.

According to a second aspect of the present invention, a component handling apparatus for handling components, and while transporting the same, is provided and includes a component feeding device, a component transporting device, and an index table.

The component feeding device includes a vibration feeder for feeding a plurality of components, and a component delivering section for individually delivering the components fed by the vibration feeder.

The component transporting device includes a hollow transportation path for transporting the components, having a component intake port on one end and a component discharging port on the other end. The component intake port is positioned so as to face toward the component delivering section and is provided with a gas intake port for the admission of a flow of gas in the vicinity of he component intake port. The flow of gas taken through the gas intake port provides the component intake port with a negative pressure for feeding components from the component delivery section to the component intake port. The admitted gas flow also provides a driving force for transporting the component with the airflow through the transportation path and towards the component discharging port.

The index table is provided with a plurality of holding recesses along the periphery thereof for individually receiving the electronic components transported by the airflow.

In the component handling apparatus, according to the second aspect of the present invention, the components delivered from the component delivering section are sent to the component intake port. This is accomplished while the component maintains the state of being suspended in the air based on the negative pressure applied to the component intake port. There may be further provided a visual inspection section for picking up the image of the component while it is suspended in the air, and prior to being fed into the component intake port.

As described above, when the component handling apparatus is provided with a visual inspection device, there may be further provided a visually defective components discharging section. This section discharges the visually defective components at a predetermined position on the transportation path, while the components are transported, along with the rotation of the index table.

When the components are electronic components, a characteristic measuring section is provided for measuring the characteristic of the electronic components at a predetermined position on the transportation path, while the electronic components are transported, along with the rotation of the index table.

The component handling apparatus may be provided with a taping device for taping the components at a predetermined position on the transportation path, while the components are transported along with the rotation of the index table.

The component handling apparatus, according to the third aspect of the present invention, is an apparatus for handling the electronic components, more specifically, for handling these components while transporting the same.

The present invention also includes the method for handling the components, wherein the components are handled by the use of the component handling apparatus as described above.

DESCRIPTION OF THE PREFERRED EMBODIMENTS

Figure 1:
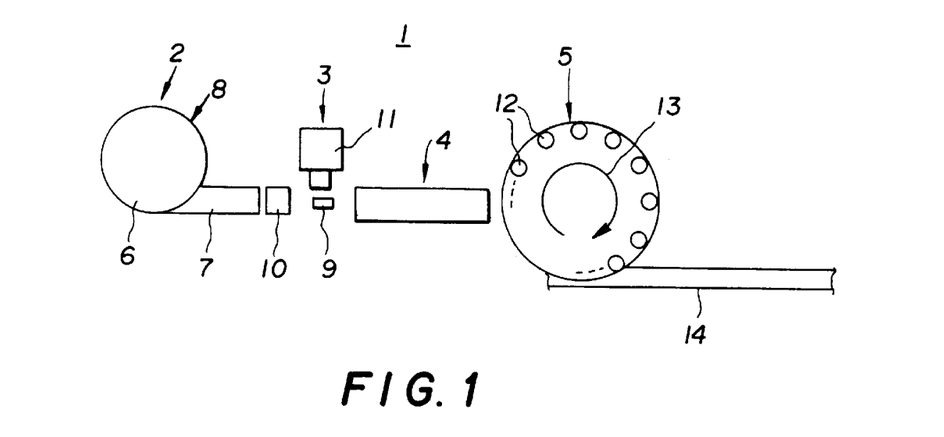
FIG. 1 is a plan view showing a general diagrammatic structure of the component handling apparatus 1 according to an embodiment of the present invention.

FIG. 1 is a diagrammatic structure showing the components of the electronic component handling apparatus 1 in general according to an embodiment of the present invention.

The handling apparatus 1 comprises a component feeding device 2, a visual inspection section 3, a component transporting device 4 and an index table 5.

The component feeding device 2 comprises a component feeder portion 6, a line feeder portion 7, and a vibration feeder 8. The electronic component 9 fed from the component feeder portion 6 via the line feeder portion 7 is fed to the component delivery section 10. The component delivery section 10 is free from vibration. The detailed description about the component delivery section 10 will be given later.

The visual inspection section 3 picks up the image of the electronic component 9 in the section between the component delivery section 10 and the component transporting device 4, and comprises a camera 11 composed of, for example, a CCD camera. The detailed description about the visual inspection section 3 will be given later as well.

The component transporting device 4, to put it briefly, transports the electronic component 9 using supplied airflow. The detailed description of this component will be given later.

The index table 5, as shown in FIG. 1 diagrammatically, has a plurality of holding recesses 12 along the periphery thereof. The index table 5 is rotated intermittently in the direction shown by the arrow 13, and the electronic components discharged from the component transporting device 4 are received in the respective holding recesses 12, one by one, and transported in the circumferential direction along with the rotation of the index table 5.

Though it is not shown in FIG. 1, there is provided a station for carrying out each process, such as a characteristic measurement or a screening process, along the transportation path through which the electronic component 9 is transported along with the rotation of the index table 5. The electronic components 9 are eventually determined to be visually and characteristically satisfactory and then subjected to tapings so as to be stored in the cavity (not shown) of the tape 14.

Figure 2:
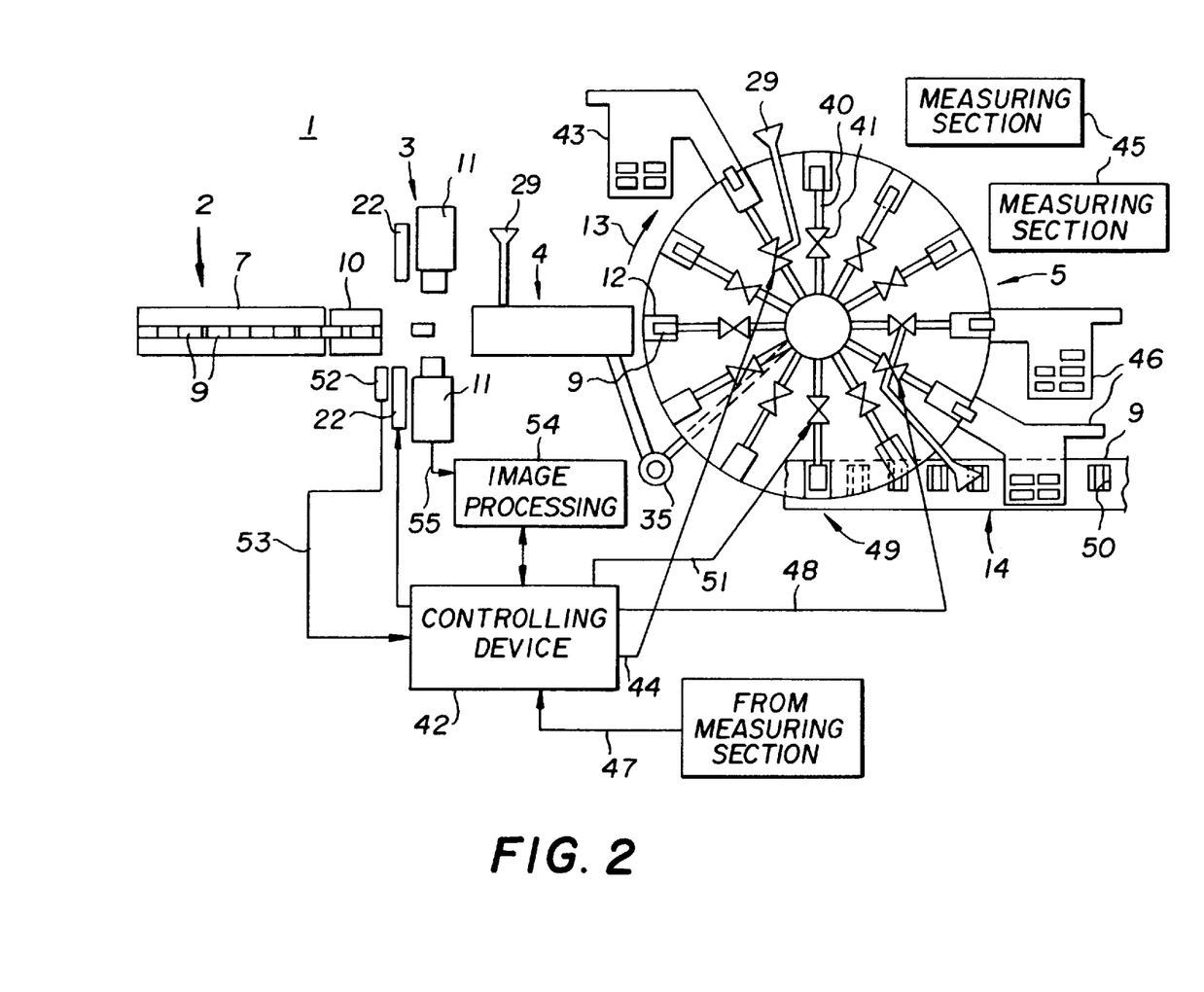
FIG. 2 is a plan view showing a detailed structure of the principal part of the component handling apparatus 1 shown in FIG. 1 in conjunction with a block diagram showing the structure of the control system.

FIG. 2 shows the principal portion of the handling apparatus shown in FIG. 1 further in detail. FIG. 3 through FIG. 11 contain explanatory drawings showing the details of each section included in the handling apparatus 1. Referring to FIG. 2 and from FIG. 3 on, the detail of the handling apparatus 1 will now be described.

The electronic components 9 delivered from the component delivery section 10 in the component feeding device 2 are, as will be described below, fed to the component transporting device 4 while maintaining the state of being suspended in the air based on the negative pressure or vacuum applied by the component transporting device 4. In this case, only the front-most electronic component 9 on the component delivery section 10 is separated from the following electronic components 9 and fed to the component transporting device 4 based on the negative pressure described above.

Figure 3:
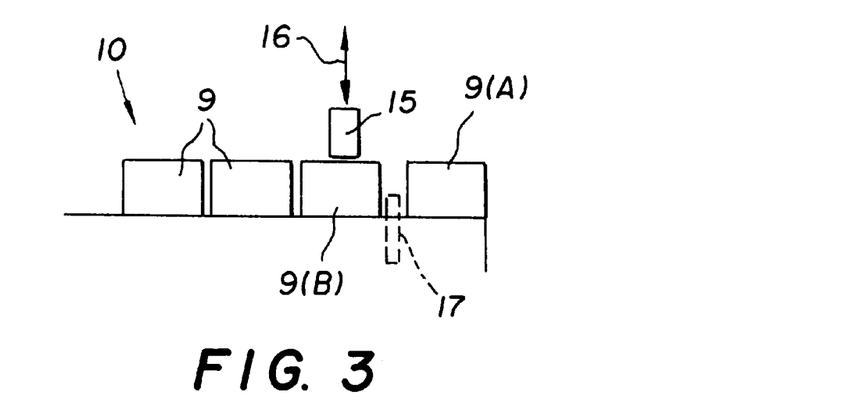
FIG. 3 is an illustrative front view showing an example of the separating mechanism for the electronic components that can be employed at the component delivery section 10 shown in FIG. 2 as needed.

In order to ensure the separation between the front-most electronic component 9 and the following electronic components 9 on the component delivery section 10, the structure as shown in FIG. 3 may be employed.

Referring now to FIG. 3, there is provided a holding pin 15 that acts upon the electronic components 9(B) found in the front-most position in the group of electronic components 9 that follows the front-most electronic component 9(A). The holding pin 15 is movable upward and downward as shown by the arrow 16 and registers the electronic component 9(B) by holding it according to the downward movement. The holding pin 15 is moved, for example, by a solenoid, and is constructed so as to move upward and downward in a predetermined timing.

It is also possible to use a wedge pin 17 shown in a phantom line in FIG. 3 instead of the holding pin 15 described above, and allow it to wedge between the front-most electronic component 9(A) and the following electronic component 9(B).

The visual inspection section 3 is constructed so that the image of the front-most electronic component fed to the component transporting device 4 is picked up in the state of being suspended in the air. Therefore, it is desired that the posture and the orbit of the electronic component 9 in the state of being suspended in the air is stable. In order to stabilize the posture and orbit, preferably the structure of the component delivery section 10 as shown in FIG. 4 and FIG. 5 is employed.

Figure 4:
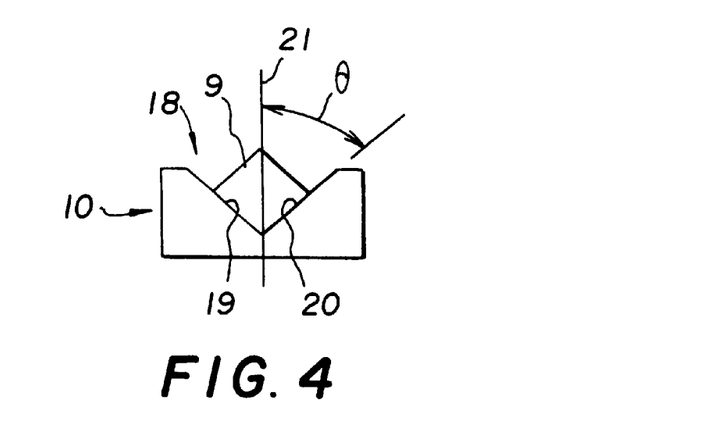
FIG. 4 is an end view of the component delivery section 10 shown in FIG. 2.
Figure 5:
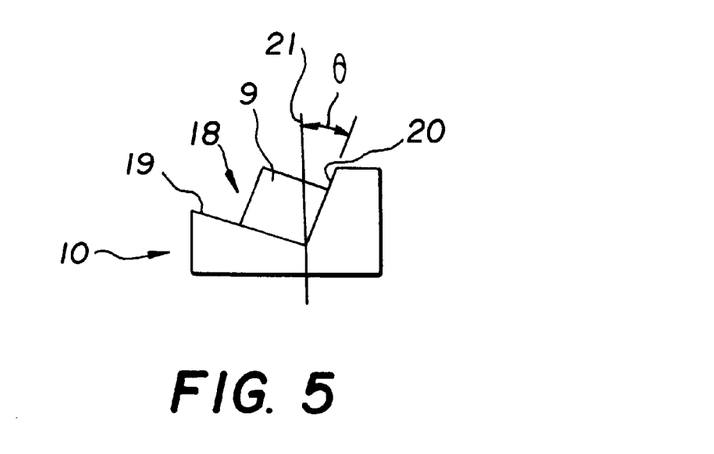
FIG. 5 is a drawing corresponding to FIG. 4 illustrating an alternative embodiment relating to the angle θ formed between the side walls 19 and 20 of the aligning groove 18.

Referring now to FIG. 4, the component delivery section 10 is formed with an aligning groove 18. The aligning groove 18 is defined by two side surfaces 19 and 20 arranged in V-shape. These side surfaces 19 and 20 are inclined at an angle $\theta$ with respect to the vertical plane 21, and typically, 45° is selected as the angle $\theta$.

Therefore, the electronic component 9 is always aligned in its fixed position by contact between the side surface of the electronic component 9 and the side surfaces 19 and 20 of the aligning groove 18 and, consequently, the electronic component 9 delivered from the component delivery section 10 can easily fly along a fixed orbit in a fixed posture. Flight in which the side surface of the electronic component 9 is inclined contributes to the stabilization of the flying posture.

The V-shaped groove of the aligning groove 18 described above is preferably provided at the line feeder portion 7 as well.

In the structure shown in FIG. 4, although the angle $\theta$ defined by the side surfaces 19 and 20 of the aligning groove 18 and the vertical plane 21 is selected to be 45°, a similar effect is achieved even when the angle $\theta$ is varied between 10° to 80°.

In FIG. 4 and FIG. 5, the shape of the electronic component 9 is shown to be a square prism, and the electronic component 9 may be aligned in a fixed place by the aligning groove 18 even when the electronic component 9 is a rectangular shape.

Figures 6, 7:
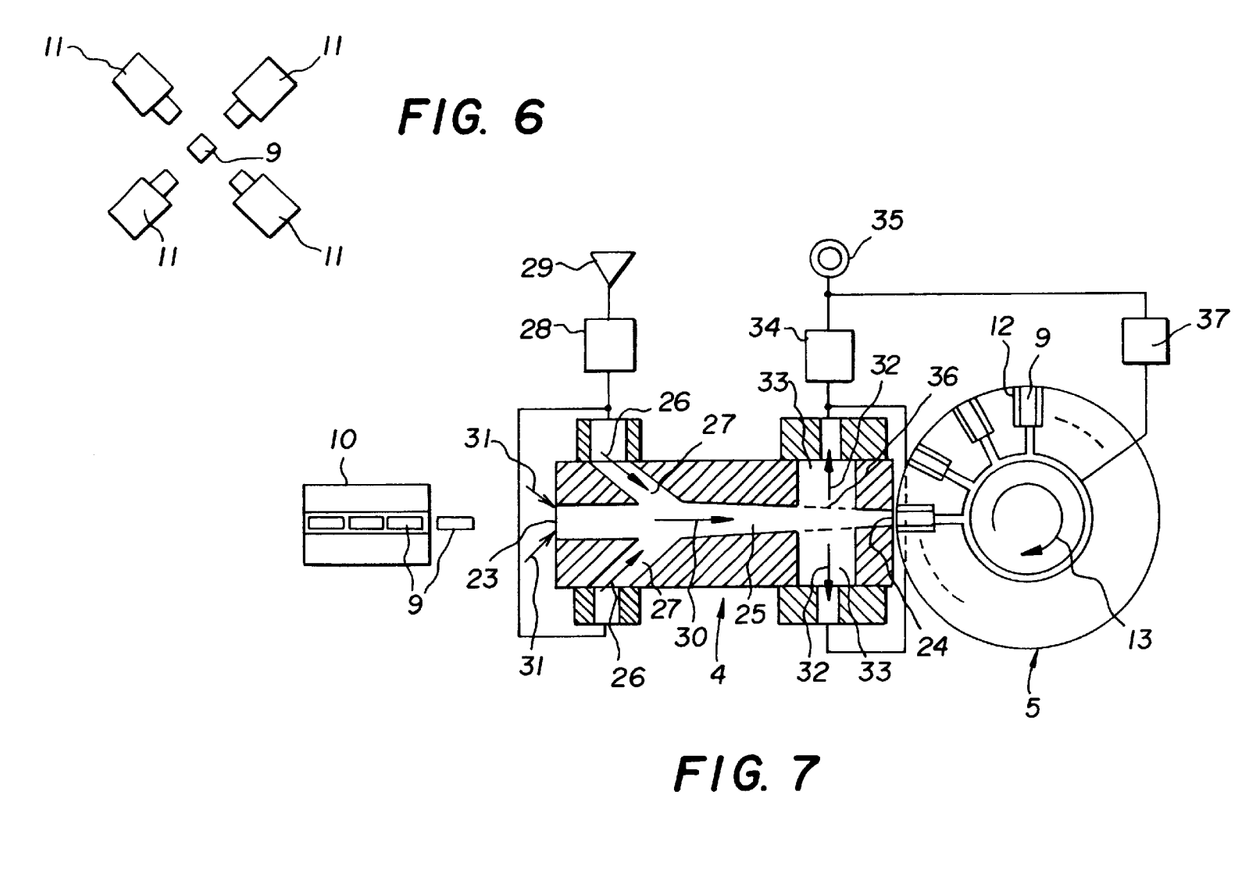
FIG. 6 is a drawing showing the arrangement of the cameras 11 to be provided at the visual inspection section 3 shown in FIG. 2.
FIG. 7 is a cross sectional view showing the component transporting apparatus 4 shown in FIG. 2 in detail in conjunction with the component delivery section 10 and the index table 5.

In the visual inspection section 3, since the image of the electronic component 9 is picked up from four directions respectively, it is preferable to provide four cameras 11 as shown in FIG. 6. When the electronic component 9 is a square prism in shape, the cameras 11 are installed corresponding to the respective side surfaces. The electronic component 9 is transported with the side surfaces inclined as described before, and the four cameras 11 are placed so as to be diagonally opposed with respect to each other.

By arranging the cameras 11 as described above, the images of almost all of the four side surfaces of the electronic component 9 can be picked up simultaneously, thereby increasing the speed of visual inspection. By arranging the cameras 11 so as to be diagonally opposed with respect to each other, the space required for the arrangement of the cameras 11 may be reduced in comparison with the case where the cameras 11 are arranged so as to be opposed in the horizontal and vertical directions. In addition, the cameras located at the lower positions may not suffer too much from dust being accumulated on their lenses. Therefore, it is not necessary to provide a specific mechanism for cleaning, and a correct image can be picked up for a relatively long term.

It is not necessary to arrange the four cameras 11 at the same position on the orbit. In other words, it is not necessary to arrange the four cameras 11 so as to pick up the image simultaneously. Therefore, the four cameras 11 may be positioned at a plurality of positions on the orbit separately.

For example, in FIG. 6, the upper two cameras 11 and the lower two cameras 11 are arranged at the different positions with respect to each other so that the two cameras 11 being diagonally opposed are not arranged in the same position, a back-lighted state caused by the light sources 22 provided in association with the cameras 11 (See FIG. 2) can be prevented.

It is also possible to pick up the images of the two side surfaces out of four side surfaces of the electronic component 9 on the component delivery section 10, and of the remaining two surfaces in the state of being suspended in the air after delivered from the component delivery section 10.

When picking up the image of the electronic component 9 on the component delivery section 10, it may be performed either from above the component delivery section 10 or from below through the component delivery section 10.

In the latter case where the image is picked up from below through the component delivery section 10, the component delivery section 10 may be made of a transparent material. However, when there are scratches on the aligning groove 18 of the component delivery section 10, for example, these scratches are also picked up as an image, which may lead to misjudgments in the visual inspection of the electronic component 9. In order to prevent such misjudgments, the component delivery section 10 may be formed of a scratch proof transparent material so that the aligning groove 18 resists scratches. In order to achieve this object, the component delivery section 10 may be advantageously made, for example, of acrylic resin or sapphire glass.

When picking up the image of the electronic component 9 on the component delivery section 10 as described above, since vibrations from the vibration feeder 8 are not transmitted to the component delivery section 10, and thus the component delivery section 10 if free from vibration, the image of the electronic component 9 can be picked up with stability.

The image pick-up of the electronic component 9 for the visual inspection may be carried out only on the component delivery section 10.

FIG. 7 is a cross section of the component transporting device 4. As shown in FIG. 7, the component transporting device 4 defines a hollow transportation path 24 for transporting the electronic components 9 having a component intake port on one end and a component discharging port on the other end.

The component transporting device 4 is provided, in the vicinity of the component intake port, with a gas intake port 27 for the admission of the flow of gas, such as air, into the transportation path 25 as shown by the arrow 26. The gas intake port 27 is connected to the pressurized air source 29 via the control valve 28. The gas flown through the gas intake port 27 generates an airflow in the transportation path 25 as shown by the arrow 30, which applies a negative pressure for urging the electronic component 9 from outside into the component intake port 23 as shown by the arrow 31. The electronic components 9 delivered from the component delivery section 10 described above are thus transported into the component intake port 23 while suspended in the air, based on the negative pressure applied to the component intake port 23.

As described above, the airflow generated by the gas flown through the air intake port 27 generates a drive force to transport the electronic components 9 with the airflow through the transportation path 25 toward the component discharging port 24.

Figure 8:
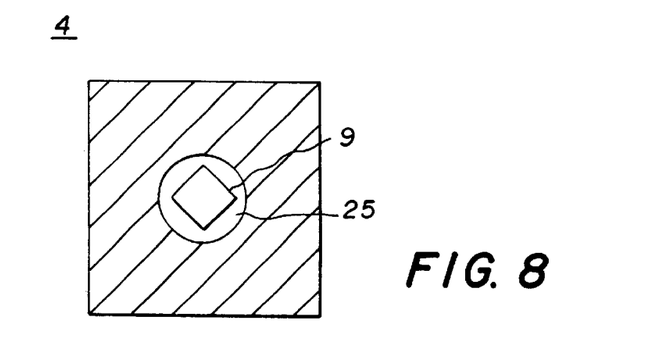
FIG. 8 is a transverse cross section showing the component transporting device 4 shown in FIG. 7 in conjunction with the electronic component 9.

FIG. 8 is a cross sectional view of the component transporting device 4 showing a state in which the electronic component is being transported with the airflow. As shown in FIG. 8, it is ideal that the electronic component 9 being transported with the airflow is kept in the state of being suspended in the air without coming into contact with the wall surface defining the transportation path 25.

Referring again to FIG. 7, the component transporting device 4 further comprises a gas discharging port 33 in the vicinity of the component discharging port 24 for discharging the gas in the transportation path 25 as shown by the arrow 32. The air discharging port 33 is connected with a vacuum source 35, via a control valve 34, thereby forcing the gas to be discharged through the gas discharging port 33. Air ventilation walls 36 separate the transportation path 25 and the gas discharging port 33 so that the electronic components 9 are prevented from being deviated out of course and proceeding to the gas discharging port 33 involuntarily.

The gas discharged through the air discharging port 33 described above acts upon the electronic components 9 in the transporting path 25 in such a manner that the speed of the electronic component 9 being transported is reduced. Though the electronic component 9 discharged from the component discharging port 24 of the component transporting device 4 is received in the respective holding recesses 12 formed on the index table 5 one by one, a reduction in speed of the electronic component 9 as described above prevents the electronic component 9 from coming into collision with the wall surface of the holding recess 12 with an impactive force, and thereby preventing the resultant damage of the electronic component 9.

Vacuum from the vacuum source is also applied to each holding recess 12 formed on the index table via the control valve, which serves to locate the electronic component 9 in each holding recess 12 by adsorption.

As is clearly shown in FIG. 7, the transportation path 25 is preferably tapered from the component intake port 23 toward the component discharging port 24. Owing to such a tapered path, the electronic component 9 can be stably sucked by the negative pressure at the component intake port 23 and easily fed to an accurate position in the holding recess 12 on the index table in a stable posture at the component discharging port 24.

Figure 9:
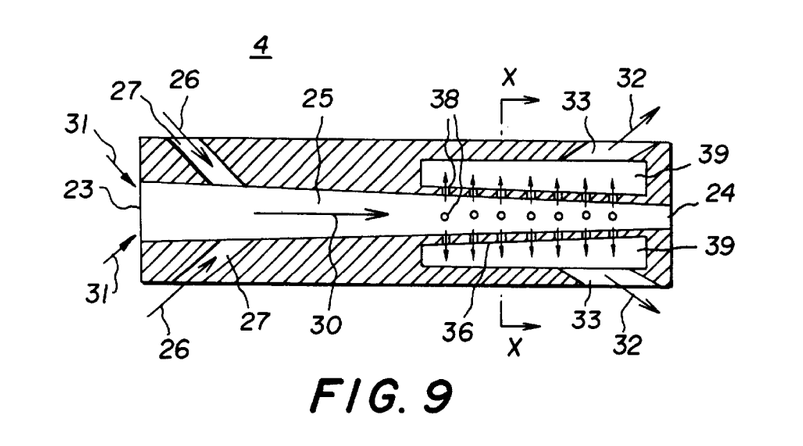
FIG. 9 is a vertical cross section showing the structure of the component transporting device 4 shown in FIG. 7 more in detail.
Figure 10:
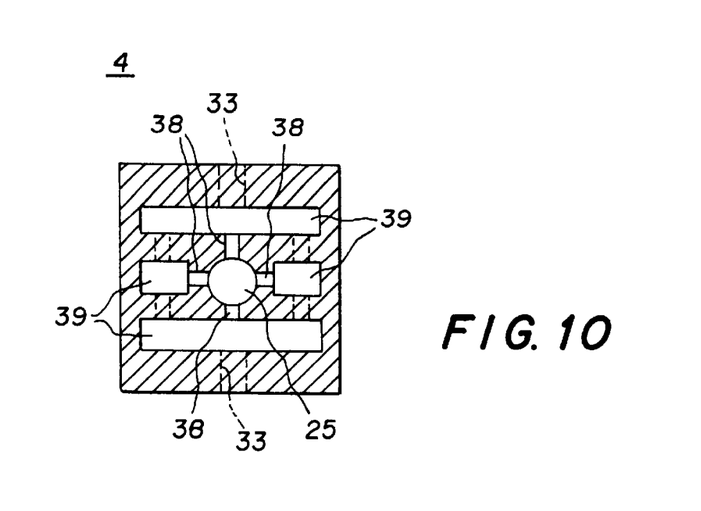
FIG. 10 is a transverse cross section taken along the line X—X of FIG. 9.

Referring now to FIG. 9 and FIG. 10, more specific structure of the component transporting device 4 described above is shown. FIG. 9 is a vertical cross section of the component transporting device 4, and FIG. 10 is a horizontal cross section taken along the line X—X of FIG. 9. In FIG. 9 and FIG. 10, the identical numerals are designated to the elements identical to the elements shown in FIG. 7, and overlapped descriptions are omitted.

FIG. 9 and FIG. 10 show the preferred structure of the component transporting device 4, particularly on the side of the gas discharging port 33. In other words, a number of through holes 38 of small diameters are formed in a vicinity of the component discharging port 24 of the transportation path 25 for a relatively long range for defining an air ventilating wall 36 shown in FIG. 7, and an exhaust hood 39 is provided around the transportation path 25 so as to communicate with the space in the transportation path 25 through the through holes 38. Therefore, the air in the transporting path 25 is discharged through the through holes 38, the exhaust hood, and the gas discharging port 33.

By providing an exhaust hood 39 and a number of through holes 38 between the exhaust hood 39 and the transportation path 25, so as to discharge the gas in the transporting path 25, the state of an exhaust through the respective through holes may be stable and a braking force may be applied to the electronic component 9 (See FIG. 8) transported with the airflow shown by the arrow 30 across a relatively wide range with stability.

Referring again to FIG. 2, the structure relating the index table 5 will be described. Each one of the pluralities of holding recesses 12 formed along the periphery of the index table 5 is applied with vacuum from the vacuum source 35, which locates the electronic component in each holding recess by suction force generated by the vacuum. Each holding recess 12 is provided with a vacuum through a conduit 40. The conduit 40 is provided with a valve 41. The valve 41 is controlled by the controlling device 42 and thereby being switched between a state in which a vacuum is supplied and a state in which a vacuum is not supplied.

When the valve is switched to a non-vacuum state, there may be a case where the pressurized air is supplied from the pressurized air source 29 and the control device 42 controls the electronic component 9 so that it is forced out from the holding recess 12.

At the first position on the transportation path through which the electronic components 9 are transported along with the rotation of the index table, there is provided a visually defective components discharging section 43. The visually defective components discharging section 43 discharges the electronic components 9 determined to be visually defective at the visual inspection section 3. In such a manner, when the electronic components 9 is determined to be visually defective at the visual inspection section 3, the valve 41 is actuated by a visually defective signal 44 from the control device 42, and then a supply of vacuum from the vacuum source 35 is stopped and the pressurized air from the pressurized air source 29 is applied to the conduit 40 so that the electronic component 9 is forced out and into the visually defective component discharging section 43.

At the second position following the visually defective component discharging section 43 on the transportation path through which the electronic component 9 is transported along with the rotation of the index table, there is provided a characteristic measuring section 45. The characteristic measuring section 45 measures characteristics of the electronic components 9 such as the values of electrostatic capacitance, resistance or inductance. Therefore, there is provided a measuring terminal that comes into contact with the terminal of the electronic component 9. Though there are shown characteristic measuring sections 45 at two positions in FIG. 2, the number of the characteristic measuring section 45 may be changed according to the number of the required items to be measured.

At the third position following the characteristic measuring section 45 described above on the transportation path through which the electronic component 9 is transported along with the rotation of the index table 5, there is provided the characteristically defective component discharging section 46. The characteristically defective component discharging section 46 discharges the electronic components 9 determined to be characteristically defective at the characteristic measuring section 45. The reason there are shown characteristically defective component discharging sections 46 at two positions in FIG. 2 is that they are provided in association with the characteristic measuring sections 45 provided at two positions for discharging the characteristically defective components for each items to be measured.

The measured data 47 obtained at the characteristic measuring section 45 described above is fed to the control device 42, and when the measured data 47 is determined to be defective at the control device 42, a characteristically defective signal 48 is supplied from the control device 42, and the characteristically defective signal 48 actuates the valve 41 relating to the characteristically defective component discharging section 46. The actuation of the valve 41 stops the supply of a vacuum and the pressurized air from the pressurized air source 29 is introduced into the holding recess 12 through the conduit 40 to force the electronic component that is characteristically defective out into the characteristically defective component discharging section 46.

At the fourth position, following the characteristically defective component discharging section 46 described above, on the transportation path through which the electronic component 9 is transported along with the rotation of the index table 5, there is provided a characteristically satisfactory component discharging section 49. The characteristically satisfactory component discharging section 49 discharges the electronic component 9 determined to be characteristically satisfactory at the characteristic measuring section 45. In this embodiment, a taping device for taping the electronic component 9 is provided at the characteristically satisfactory component discharging section 49. Therefore, there is shown a tape 14 provided with a plurality of cavities for receiving the electronic component 9 so that they are distributed along the length of the tape 14.

The measured data 47 obtained at the characteristic measuring section 45 is, as described above, supplied to the control device 42, and when the characteristic of the electronic component 9 is determined to be satisfactory at the characteristic measuring section 45, a characteristically satisfactory signal 51 is supplied from the control device 42. The characteristically satisfactory signal 51 actuates the valve 41 relating to the characteristically satisfactory component discharging section 49 and stops the supply of a vacuum to the holding recess 12. The electronic component 9 is then held by the pickup device, and inserted into the corresponding cavity 50 on the tape 14.

The characteristically satisfactory component discharging section 49 may not necessarily include a taping device, but may have a structure in which the electronic components 9 determined to be characteristically satisfactory are just discharged in the unpackaged state. In other words, it may be provided just as a device for discharging the components in bulk.

Though it is not shown in FIG. 2, there may be further provided a marking section for applying marks to the electronic components 9 at the predetermined position on the transportation path through which the electronic component 9 moves along with the rotation of the index table 5. This marking can be placed, for example, between the characteristically defective component discharging section 46 and the characteristically satisfactory component discharging section 49.

Referring now to FIGS. 2 and 7, the operation of the handling apparatus 1 will be described in general. The electronic component 9 delivered from the component delivery section 10 in the component feeding device is transported into the component intake port 23 while maintaining the state of being suspended in the air based on the negative pressure applied to the component intake port 23 of the component transporting device 4.

The sensor 52 detects that the electronic component 9 described above is passed by, and a component-passed signal 53 is supplied to the control device 42. The control device 42 turns the light source 22 on at a predetermined timing upon receipt of a component-passed signal 53. The control device 42 controls the image processing device 54, and the image processing device 54 processes a image signal 55 based on the image picked up by the camera 11, and the processed signal is supplied to the control device 42. The control device 42 determines the quality of the appearance of the electronic component, and when it is determined to be visually non-satisfactory, a visually defective signal 44 is supplied as described above.

Subsequently, as described above, the electronic component 9 supplied to the component intake port 23 of the component transporting device 4 is transported with the airflow through the transportation passage 25, and the speed of transportation is reduced in the vicinity of the component discharging port 24 and then received in each holding recess 12 formed on the index table 5.

The electronic component 9 is then transported along with the rotation of the index table 5. While the electronic component 9 moves from upstream to downstream along the transportation path, the electronic component 9 determined to be visually defective is discharged at the visually defective component discharging section 43. If the electronic component 9 is visually satisfactory, the characteristic of the electronic component is then measured at the measuring section 45. If it is determined to be defective, it is removed at the characteristically defective component discharging section 46. If, however, the electronic component 9 is determined to be characteristically satisfactory at the characteristically satisfactory component discharging section 49, it is subjected to taping at section 49.

According to the handling apparatus 1 as is described thus far, a series of processes such as a visual inspection, a discharge of the visually defective component, a characteristic measurement, a discharge of the characteristically defective component, and a discharge of the characteristically satisfactory component may be carried out successively.

Figure 11:
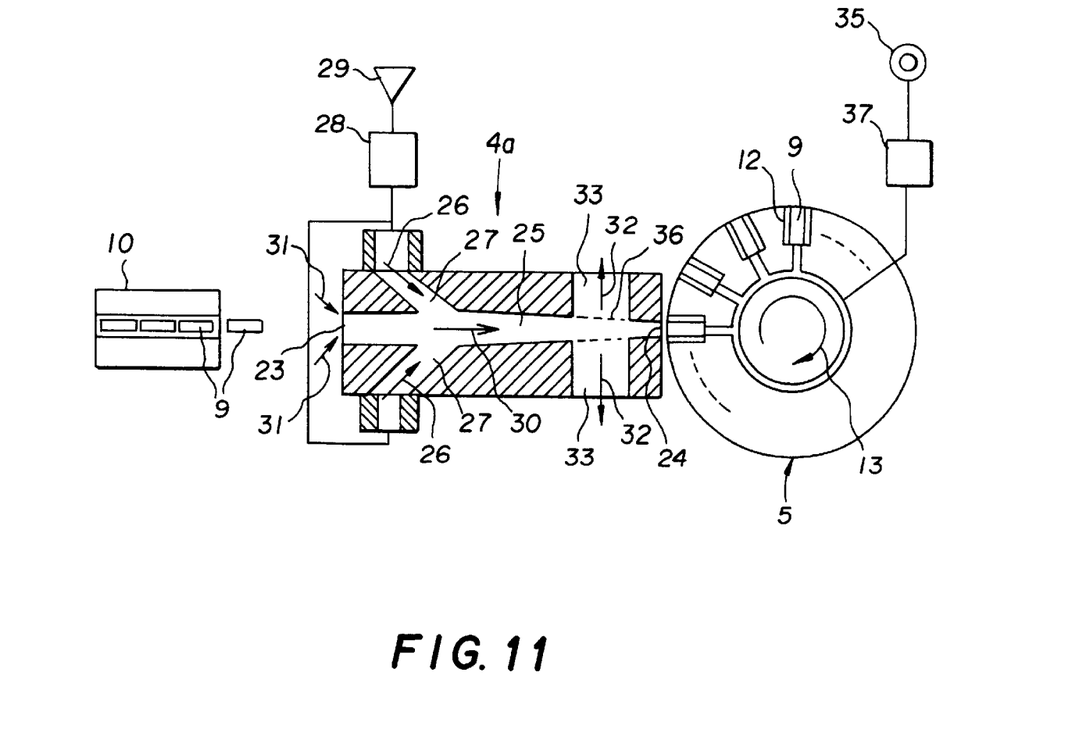
FIG. 11 is a drawing corresponding to FIG. 7 showing the component transporting device 4a according to another embodiment of the present invention.

FIG. 11 is a drawing corresponding to FIG. 7 described above showing an alternative embodiment of the component transporting device 4. The identical numerals are designated to the elements corresponding to those shown in FIG. 7, and the overlapped description will be omitted.

While the component transporting device 4 shown in FIG. 7 comprises means for controlling the discharge pressure of the gas at the gas discharge port 33, the component transporting device 4a shown in FIG. 11 is characterized in that the gas discharge port 33 is open to the atmosphere.

Accordingly, the component transporting device 4a shown in FIG. 11 has an advantage in that the structure of the device can be simplified. In this component transporting device 4a, control of the quantity of the gas passing through the air ventilation wall 36 and control of the air pressure flown into the gas intake component 27 are carried out for controlling the extent of reduction in transport speed of the electronic component 9 transported with the airflow through the transportation path 25.

Though the embodiments of the present invention have been described thus far, a variety of alternative embodiments are possible within the scope of the present invention.

For example, while the electronic component 9 is disclosed as the component to be handled in the embodiment shown in the figure, the present invention may be applied to the components other than the electronic component.

According to the present invention, a component can be handled effectively while transporting it at high speed. In the component handling apparatus, when the component transporting apparatus is constructed in such a manner that the transport speed of the component with the airflow is reduced in the vicinity of the component discharging port, the component discharged from the component discharging port is prevented from coming into collision with the wall surface for receiving the component with an impactive force, thereby preventing the component from being damaged or jumping out due to the rebound thereof. Since the component can be transported until it reaches the vicinity of the component discharging port, the number of the components handled in a unit time may be easily increased.

In the transportation path described above, a tapered shape from the component intake port toward the component discharging port ensures that the component is reliably transported to the component intake port and discharged from the component discharging port at an accurate position.

When means for controlling the gas discharging pressure is provided at the gas discharging port for discharging a gas in order to reduce the speed of the component being transported, the extent of the reduction in speed of the component being transported can easily be controlled.

When the gas discharging port is open toward the atmosphere, the structure of the component transporting device may be simplified.

The present invention is applied to the handling of electronic components, and provided is an index table having a plurality of holding recesses for receiving the electronic component discharged from the component discharging port. The respective holding recesses on the index table "catch" each component, one by one, as the table rotates and a characteristic measuring section is provided at a predetermined position on the transportation path. The electronic components are transported along with the rotation of the index table, in order to measure the characteristic of the electronic components during a series of processes while transporting the components. This facilitates provision of a period of time for accurately measuring the characteristic of the electronic components.

By providing a characteristically defective component discharging section for discharging the defective electronic components downstream of the characteristic measuring section, or providing a characteristically satisfactory component discharging section for discharging a characteristically satisfactory electronic component downstream, the effective screening of the electronic component based upon the characteristic measurement can be made following the characteristic measurement process described above. This, of course, facilitates automatization of such a screening process. A taping device for taping the electronic components at the characteristically satisfactory component discharging section is provided to form of a final product of the electronic component for further processing.

In the present invention, the component handling apparatus delivers the component from the component delivery section of the component feeding device to the component intake port. The component is suspended in the air due to the negative pressure applied to the component intake port of the component transporting device. The image of the component is viewed while being suspended in the air, and prior to being fed into the component intake port. As such, the image of the component can be picked up from many directions. For example, four directions can be viewed simultaneously, thereby increasing the efficiency of the visual inspection of the component.

When the component feeding device described above is provided with a vibration feeder, the orbit of the component in the state of being suspended in the air may be stabilized by maintaining the component delivery section free from vibration, thereby enabling more accurate viewing image.

The present invention employs a construction in which the component delivery section is provided with an aligning groove defined by two side surfaces arranged in a V-shape. The side surfaces of the aligning groove are inclined at an angle of between 10° and 80° with respect to the vertical plane. This arrangement allows the components to be kept at predetermined positions in the aligning groove at all times. Furthermore, the side surfaces may be kept in an inclined position when the component is a square prism in shape. This facilitates stabilized flight orbit of the component.

Therefore, when the component handling device according to the present invention is provided with 1) a component transporting device, 2) a component feeding device, 3) a visual inspection section, 4) an index table, and 5) a characteristic measuring section (for example, a visual inspection), a characteristic measurement of the electronic component can be performed midway a continuous transportation path. The visual inspection and the characteristic measurement can be carried out efficiently and successively under high-speed transportation, and the automatization of the process may easily be realized.

What is claimed is:

1. A handling apparatus for handling a component while transporting, comprising:

a component feeding device;

a component transporting device; and an index table;

wherein said component feeding device comprises a vibration feeder for feeding a plurality of components, and a component delivering section for delivering the components fed by the vibration feeder one by one;

wherein said component transporting device defines a hollow transportation path for transporting the components having a component intake port on one end and a component discharging port on the other end, the component intake port is positioned so as to face toward the component delivering section, and provided with a gas intake port for admission of a flow of gas in a vicinity of the component intake port, and the flow of gas taken through the gas intake port provides the component intake port with a negative pressure for feeding components from the component delivering section while suspended in the air to the component intake port, and provides a driving force for transporting the component with airflow through the transportation path toward the component discharging port;

wherein said index table is provided with a plurality of holding recesses along a periphery thereof for receiving the components transported with the airflow through the transportation path and discharged from the component discharging port one by one.

2. A handling apparatus as set forth in claim 1:

wherein a component delivered from the component delivering section is sent to the component intake port while being suspended in the airflow based on the negative pressure applied to the component intake port, and a visual inspection section for picking up the image of an component suspended in the airflow prior to be fed into the component intake port.

3. A component handling apparatus as set forth in claim 2, wherein the index table is rotatable, and further comprising a visually defective components discharging section for discharging visually defective components at a predetermined position in the transportation path through which the components are transported along with rotation of the index table.

4. A component handling apparatus as set forth in claim 1, wherein said components are electronic components, and wherein said component handling apparatus further comprises a characteristic measuring section for measuring a characteristic of the electronic components provided at a predetermined position on the transportation path through which the electronic components are transported along with rotation of the index table.

5. A component handling apparatus as set forth in claim 1, wherein the index table is rotatable, and further comprising a taping device for taping the components at a predetermined position on the transportation path through which the components are transported along with rotation of the index table.

6. A component handling apparatus as set forth in claim 1, further comprising treatment means for treatment of a component in front of the component transporting device.

7. A component handling apparatus as set forth in claim 1, further comprising a treatment device provided between the component feeding device and the component transporting device.

8. A handling apparatus as set forth in claim 1, further comprising a visual inspection system provided between the component feeding device and the component transporting device.

* * * * *